United States Patent
Koizumi et al.

(10) Patent No.: US 6,404,021 B1
(45) Date of Patent: Jun. 11, 2002

(54) LAMINATED STRUCTURE AND A METHOD OF FORMING THE SAME

(75) Inventors: Masato Koizumi; Kazuya Okubo, both of Yamanashi-ken; Tsuyoshi Takahashi, Nirasaki; Tsuyoshi Hashimoto, Kofu; Kimihiro Matsuse, Tama, all of (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/023,712

(22) Filed: Feb. 13, 1998

(30) Foreign Application Priority Data

Feb. 25, 1997 (JP) .............................. 9-056994

(51) Int. Cl.[7] .................. H01L 29/76; H01L 29/94; H01L 31/062; H01L 31/113; H01L 31/119
(52) U.S. Cl. .................. 257/381; 257/383; 257/384; 257/385; 257/412
(58) Field of Search ................ 257/412, 754, 257/755, 249, 381–383, 486, 385

(56) References Cited

U.S. PATENT DOCUMENTS

| | | | | |
|---|---|---|---|---|
| 5,023,679 A | * | 6/1991 | Shibata ...................... 357/23.4 |
| 5,256,894 A | * | 10/1993 | Shino ......................... 257/388 |
| 5,332,692 A | | 7/1994 | Saitoh | |
| 5,355,010 A | * | 10/1994 | Fujii et al. .................. 257/377 |
| 5,397,909 A | * | 3/1995 | Moslehi ...................... 257/383 |
| 5,428,244 A | | 6/1995 | Segawa et al. | |
| 5,431,014 A | | 7/1995 | Ishihara | |
| 5,512,502 A | | 4/1996 | Ootsuka et al. | |
| 5,710,454 A | * | 1/1998 | Wu ............................. 257/413 |
| 5,744,845 A | * | 4/1998 | Sayama et al. ............. 257/371 |
| 5,767,558 A | * | 6/1998 | Lo et al. ..................... 257/412 |
| 5,801,416 A | * | 9/1998 | Choi et al. .................. 257/335 |
| 6,001,681 A | * | 12/1999 | Liu et al. .................... 438/238 |
| 6,114,736 A | * | 9/2000 | Balasubramanyam et al. ... 257/412 |

FOREIGN PATENT DOCUMENTS

| | | | |
|---|---|---|---|
| EP | 0 430 429 | 6/1991 | |
| EP | 0 466 166 | 1/1992 | |
| EP | 0 529 952 | 3/1993 | |
| EP | 0 746 027 | 12/1996 | |
| JP | 61-27627 | 2/1986 | |
| JP | 1-76759 | 3/1989 | |
| JP | 40 2-39471 | * 2/1990 | ............. 257/413 |
| JP | 40 2-155273 | * 6/1990 | ............. 257/413 |
| JP | 2-181918 | 7/1990 | |
| JP | 5-315333 | 11/1993 | |
| JP | 9-17705 | 1/1997 | |

* cited by examiner

*Primary Examiner*—Eddie Lee
*Assistant Examiner*—Jesse A. Fenty
(74) *Attorney, Agent, or Firm*—Oblon, Spivak, McClelland, Maier & Neustadt, P.C.

(57) ABSTRACT

A method of forming a gate electrode of a multi-layer structure includes a step of supplying a processing gas for poly-crystal film formation and impurities of a P-type into a film formation device, to form a poly-crystal silicon layer doped with P-type impurities, on a surface of a gate film target, a step of maintaining the processing target in the film formation device to prevent formation of an oxide film might not be formed on the poly-crystal silicon layer, and a step of supplying a processing gas for tungsten silicide film formation and impurities of a P-type into the film formation device, to form a tungsten silicide layer doped with impurities of P-type impurities, on the poly-crystal silicon layer on which no oxide film is formed.

8 Claims, 6 Drawing Sheets

LAMINATED STRUCTURE AND A METHOD OF FORMING THE SAME

BACKGROUND OF THE INVENTION

The present invention relates to a laminated structure or multi-layer structure such as a gate electrode formed on a processing target comprising a semiconductor substrate or a glass substrate, and a method of forming the same.

In general, in steps of manufacturing a semiconductor integrated circuit, a desired element or elements are obtained by repeatedly performing film formation, pattern etching, and the like on a semiconductor wafer or a glass plate as a processing target.

For example, when a gate element for an MOSFET is formed on the surface of the wafer, impurities of one conductive type are diffused into positions where a source region 2 and a drain region 4 should be formed, in a wafer W, and a gate oxide film 6 made of, for example, $SiO_2$ is formed on the area between the positions on the surface of the wafer while a source-drain channel is formed below the gate oxide film 6, as shown in FIG. 7A. Further, a gate electrode 8 made of a conductive film is formed on the gate oxide film 6, to form a transistor.

In recent days, the gate electrode 8 does not have a single-layer structure but has a multi-layer structure and has a two-layer structure in most cases, in consideration of conductivity. For example, a gate electrode 8 is formed by sequentially layering a poly-crystal silicon layer 10 doped with phosphorus and a metal silicide layer such as a tungsten silicide layer 11, on a gate oxide film 6.

In accordance with down-sizing and high-integration of a semiconductor integrated circuit in recent days, the processing line width and the gate width are narrowed more and more and the film thickness tends to be thinner and thinner in response to demands for multi-layering. Even though the line width is narrowed, it is demanded that electric characteristics of respective layers and interlayer electric characteristics should maintain conventional performances or attain higher performances. In response to such demands, the gate electrode 8 adopts a two-layer structure consisting of poly-crystal silicon 10 doped with phosphorus and tungsten silicide 11.

A film made of silicon material, e.g., a poly-crystal silicon layer 10 doped with phosphorus tends to easily form a natural oxide film 14 as shown in FIG. 7B on its own surface when exposed to air, moisture, or the like. If a tungsten silicide layer 11 as a next layer is layered on the silicon layer 10 with such a natural oxide film adhered, tightness of a contact between both of the layers 10, 11 is degraded or sufficient electric conductivity cannot be maintained therebetween, resulting in a problem that the electric characteristics are degraded.

Film formations of the poly-crystal silicon layers 10 are normally carried out by batch processing in which wafers are treated in units each consisting of a number of wafers, e.g., 150 wafers, while film formations of a tungsten silicide layers 11 are carried out by piece-by-piece processing in which film formations are carried out for every wafer. As a result, the time for which one wafer is exposed to air varies between wafers, and the thickness of the natural oxide film varies accordingly. Therefore, wet washing is carried out, for example, with use of HF-based paper immediately before layering the tungsten silicide layer 11, in order to remove the natural oxide film 14 sticking to the poly-crystal silicon layer 10.

However, even when wet washing is carried out immediately before layering the tungsten silicide layer 11, it is very difficult to completely remove the natural oxide film 14 once adhered to the surface of the poly-crystal silicon layer 10, without affecting a subbing layer (i.e., the poly-crystal silicon layer 10) below the natural oxide film 14.

In this respect, there has been a proposal of a method in which a poly-crystal silicon layer 10 doped with phosphorus is formed on a semiconductor wafer in a chamber with use of a cluster tool formed, for example, by concentrating a plurality of chambers with air-tightness maintained between each other, and thereafter, the semiconductor wafer is introduced into another chamber in the same cluster tool, to form a tungsten silicide layer 11, without exposing the semiconductor wafer to air, i.e., without allowing any natural oxide film to have an opportunity to stick to the wafer (ref. Japanese Patent Application KOKAI Publication No. 9-17705).

As described above, if the tungsten silicide layer 11 is sequentially formed without exposing the wafer to air after the poly-crystal silicon layer 10 doped with phosphorus is formed, no oxide film is formed on the way of the manufacturing steps, and therefore, the entire gate electrode has a low resistance. It is possible to respond to design rules strictly limited under down-sizing and high integration.

In this case, however, phosphorus doped in the poly-crystal silicon layer 10 unevenly rediffuses into the upper tungsten silicide layer 11 through an interface between both of these layers, and therefore, phosphorus is unevenly distributed near the surface of the tungsten silicide layer (e.g., between MOSFETs formed in each wafer), resulting in another problem that the electric characteristic is degraded and/or varies. Also, as a result of this, variation appears between wafers and the manufacturing yield is degraded.

If only a slight portion or portions of natural oxide film can remain on the surface of the poly-crystal silicon layer 10 doped with phosphorus after wet washing is carried out to remove the natural oxide film, the slight portion or portions of natural oxide film prevent phosphorus from diffusing into the upper layer, resulting in no problems. However, when sequential film formation is carried out so that no natural oxide film sticks in response to demands for a low resistance required for down-sizing, a new problem of uneven diffusion of phosphorus as described above appears.

In this respect, explanation will be made in more details with reference to a graph shown in FIG. 8.

FIG. 8 is a graph showing a resistance of a gate electrode with respect to a phosphorus density of a poly-crystal silicon layer and dependence of a variation rate of the resistance, where the longitudinal axis represents the resistance and the lateral axis represents the phosphorus density of the poly-crystal layer. In this figure, a broken line A shows a case where a tungsten silicide layer 11 is formed after the poly-crystal silicon layer 10 doped with phosphorus at a phosphorus density represented by the lateral axis is formed and is thereafter exposed to air to apply thereto a natural oxide film. A continuous line B shows a case where a tungsten silicide layer 11 is formed without exposing a poly-crystal silicon layer 10 to air after the poly-crystal silicon layer 10 is formed. In the figure, black circles show average values of resistance at phosphorus densities, respectively, and lines extending vertically from the black circles as the centers indicate a variation rate (width). As is apparent from the graph, in the case of the broken line A, the resistance is slightly high while variation of the resistance is small and uniform. Hence, it is found that diffusion of phosphorus into the tungsten silicide layer is blocked by a natural oxide film. In contrast, in the case of the continuous line B, the resistance decreases as the phosphorus density increases while the variation rate of the resistance increases much more. Hence, it is found that phosphorus unevenly diffuses into the tungsten silicide layer and this case is not preferable for characteristics.

FIGS. 9A and 9B are graphs for recognizing action of phosphorus where the left longitudinal axis represents the resistance of the tungsten silicide layer, the right longitudinal axis represents the uniformity of the resistance, and the lateral axis represents a wafer number. FIG. 9A is a graph showing the sheet resistance of the tungsten silicide layer of a gate electrode with respect to 25 pieces of wafers and the uniformity thereof where a tungsten silicide layer (Wsix) 11 is formed without forming a natural oxide film on a poly-crystal silicon layer 10 doped with phosphorus. FIG. 9B is a graph showing the resistance of the tungsten silicide layer of a gate electrode with respect to 25 pieces of wafers and the uniformity thereof where the tungsten silicide layer 11 is formed without forming a natural oxide film on a poly-crystal silicon layer 10 not doped with phosphorus. In these figures, a continuous line including white circles shows the sheet resistance of the tungsten silicide layer while a continuous line including black circles shows the uniformity of the sheet resistance. Arrows are used as indications thereof. As is apparent from the graphs, in the case of doping no phosphorus into the poly-crystal layer as shown in FIG. 9B, the value of the sheet resistance is naturally constant and the uniformity of the resistance is stable. In contrast, in the case of doping phosphorus into the poly-crystal silicon layer as shown in FIG. 9A, the resistance of the tungsten silicide layer greatly changes and the uniformity of the resistance is accordingly unstable and degraded greatly. Thus, direct formation of a tungsten silicide layer 11 on a poly-crystal silicon layer 10 doped with phosphorus causes uneven diffusion of phosphorus which leads to characteristic variation and is not preferable.

BRIEF SUMMARY OF THE INVENTION

The present invention has an object of providing a multi-layer structure and a method of forming the same, capable of preventing uneven diffusion of impurities into a tungsten silicide layer as an upper layer from a poly-crystal silicon layer as a lower layer.

As to a first aspect of the present invention, there is provided a method of forming a multi-layer structure, comprising: a step of supplying a processing gas for poly-crystal film formation and first impurities of one conductive type into a film formation device, to form a poly-crystal silicon layer doped with first impurities of one conductive type, on a surface of a processing target; a step of maintaining the processing target in the film formation device to prevent formation of an oxide film on the poly-crystal silicon layer; and a step of supplying a processing gas for tungsten silicide film formation and second impurities of one same conductive type as the first impurities into the film formation device, to form a tungsten silicide layer doped with impurities of the same conductive type as the first impurities, on the poly-crystal silicon layer on which no oxide film is formed. Also, there is provided a multi-layer structure formed by the method.

According to the first aspect, it is possible to obtain a multi-layer structure made of a poly-crystal silicon layer doped with impurities of a conductive type and a tungsten silicide layer (sequentially) formed on and in direct contact with the poly-crystal silicon layer and doped with impurities of the same conductive type as the above-mentioned impurities. In this case, first, the tungsten silicide layer as an upper layer is doped with impurities without uniformity, and therefore, uneven diffusion of impurities from the poly-crystal silicon layer as a lower layer can be negligibly small in comparison with the density of the impurities in the tungsten silicide layer. As a result of this, impurities are kept uniformly diffused in the tungsten silicide layer. Therefore, characteristic variations are reduced and equalized. Second, impurities of one conductive type previously doped in the upper layer or tungsten silicide layer make the upper layer to have a crystal structure, for example, amorphous structure, which may prevent or minimize rediffusion of impurities from the lower layer or poly-crystal silicon layer, so that same effects as those above mentioned are obtained.

According to a second aspect of the present invention, a second poly-crystal silicon layer containing no impurities is inserted (or sequentially formed) as a block layer between a first poly-crystal silicon layer doped with impurities and a tungsten silicide layer containing no impurities, such that the second poly-crystal silicon layer is in direct contact with both the first poly-crystal silicon layer and the tungsten silicide layer. Therefore, uneven diffusion of impurities from the first poly-crystal silicon layer as a lower layer is blocked by the second poly-crystal silicon layer, so that impurities can be prevented from unevenly diffusing into the tungsten silicide layer as an upper layer.

According to a third aspect of the present invention, a second poly-crystal silicon layer having a low impurity density is inserted between a first poly-crystal silicon layer doped with impurities and a tungsten silicide layer containing no impurities. Therefore, uneven diffusion of impurities from the first poly-crystal silicon layer as a lower layer is blocked by the second poly-crystal silicon layer, so that impurities can be prevented from unevenly diffusing into the tungsten silicide layer as an upper layer.

In the first and second aspects, the second poly-crystal silicon layer which serves as a block layer as described above should preferably be formed to be very thin in comparison with the other layers and is set within a range of, for example, about 50 Å to 500 Å.

According to a fourth aspect of the present invention, only the surface portion of a first poly-crystal silicon layer doped with impurities has an impurity density increased excessively, or a second poly-crystal silicon layer having a high impurity density is directly formed on the first poly-crystal silicon layer. Therefore, impurities do not unevenly diffuse when impurities diffuse into the tungsten silicide layer as an upper layer.

A multi-layer structure as described above is applicable to a gate electrode of a MOSFET, for example.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 7B shows an oxide film formed on a poly-crystal silicon;

DETAILED DESCRIPTION OF THE INVENTION

In the following, an embodiment of a multi-layer structure and a manufacturing method thereof according to the present invention will be described in details below with reference to MOSFETs on the basis of appended drawings.

Figure 1:
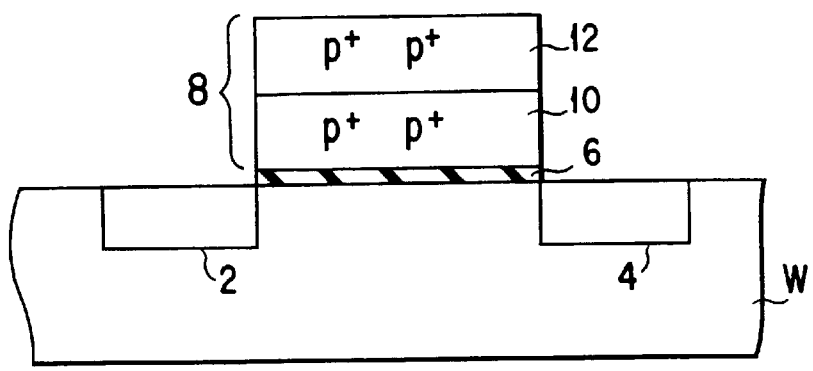
FIG. 1 is a view schematically showing a state where a multi-layer structure according to a first embodiment of the present invention is applied to a MOSFET.

In FIG. 1, a reference W denotes a semiconductor substrate as a processing target, e.g., a single crystal silicon wafer. A number of MOSFETs are formed on the wafer W by a known method. Each FET has a source region 2 and a drain region 4 formed apart from each other, and a gate oxide film 6 formed between both regions on the wafer and consisting of an insulating film made of $SiO_2$. A gate electrode 8 is formed on the gate oxide film 6. The gate electrode 8 has a multi-layer structure constructed by a poly-crystal silicon layer which is uniformly and entirely doped with first impurities of one conductive type, e.g., phosphorus (P) in case of the present embodiment, and a tungsten silicide layer 12 (Wsix) which is entirely and uniformly doped with second impurities of the same conductive type as the first impurities and which is formed so as to have a direct contact with the poly-crystal silicon layer 10. The first impurities may be the same as or different from the second impurities. Note that the first poly-crystal silicon layer 10 has the same structure as the poly-crystal silicon layer shown in FIG. 7.

Next, a method of forming the multi-layer structure will be explained below.

Firstly, a gate oxide film 6 having a thickness of, for example, about 80 to 100 Å is formed on the surface of a silicon wafer W subjected to a predetermined treatment. The gate oxide film 6 is formed by oxidation processing in which the wafer W is heated for about 10 to 30 minutes in a wet oxygen atmosphere at a temperature of about 850 to 950° C.

Subsequently, a poly-crystal silicon layer 10 is formed thereon which is doped with impurities of one conductive type such as phosphorus. Further, while maintaining the processing target in the same film formation device so that a natural silicon oxide film might not be formed on the surface of the poly-crystal silicon layer, a tungsten silicide layer 12 uniformly doped with impurities of the same type as the above-described conductive type such as phosphorus is directly formed on the poly-crystal silicon layer 10. Formation of the tungsten silicide layer 12 is carried out in the same chamber as that in which the poly-crystal silicon layer 10 has formed or a different chamber in one same cluster tool device, and film formation is sequentially carried out in the same or different chamber. Sequential film formation means that a tungsten silicide layer is directly formed on a poly-crystal silicon layer so that an oxide film formed by natural oxidization is not formed on the poly-crystal silicon layer.

The film formation is carried out under conditions as follows. Firstly, a poly-crystal silicon layer 10 is formed to have a thickness of about 1000 Å in a piece-by-piece film formation furnace, with a $PH_3$ gas, an $SiH_4$ gas, and an Ar gas flowing at 55 sccm, 400 sccm, and 540 sccm, respectively. In this state, the processing temperature and the processing pressure are respectively about 660° C. and about 7.5 Torr.

Next, a tungsten silicide layer 12 doped with phosphorus is also formed to have a thickness of about 1000 Å in the piece-by-piece film formation furnace, with a $PH_3$ gas, an $SiH_2Cl_2$ gas, a $WF_6$ gas, and an Ar gas flowing at 5 sccm, 150 sccm, 6.0 sccm, and 350 sccm, respectively. In this state, the processing temperature and the processing pressure are respectively about 630° C. and about 700 mTorr.

Further, the layers 10 and 12 are subjected to pattern etching by means of a conventional lithography technique and a conventional etching technique, and impurities are selectively injected into the silicon wafer W by means of a self-alignment technique, to form source and drain regions 2 and 4. A number of MOSFETs as described above are formed at once on the wafer.

The gate electrode 8 is thus constructed to have a multi-layer structure constructed by the poly-crystal silicon layer 10 doped with phosphorus and the tungsten silicide layer 12 also doped with phosphorus. In case of performing a heat treatment in a successive manufacturing step, even if phosphorus in the poly-crystal silicon layer 10 as a lower layer unevenly diffuses into the tungsten silicide layer 12 as an upper layer in a successive heat treatment step, the unevenness of such phosphorus does not substantially affect phosphorus uniformly diffused in the tungsten silicide layer 12, because the tungsten silicide layer 12 as an upper layer has been uniformly doped with phosphorus as impurities. Specifically, phosphorus as impurities in the tungsten silicide layer 12 maintains a uniform distribution, so that the resistance value is uniform in plane and therefore does not vary. It will be easily understood that this effect is increased as the amount of impurities previously doped uniformly in the tungsten silicide layer 12 increases.

Figure 2A:
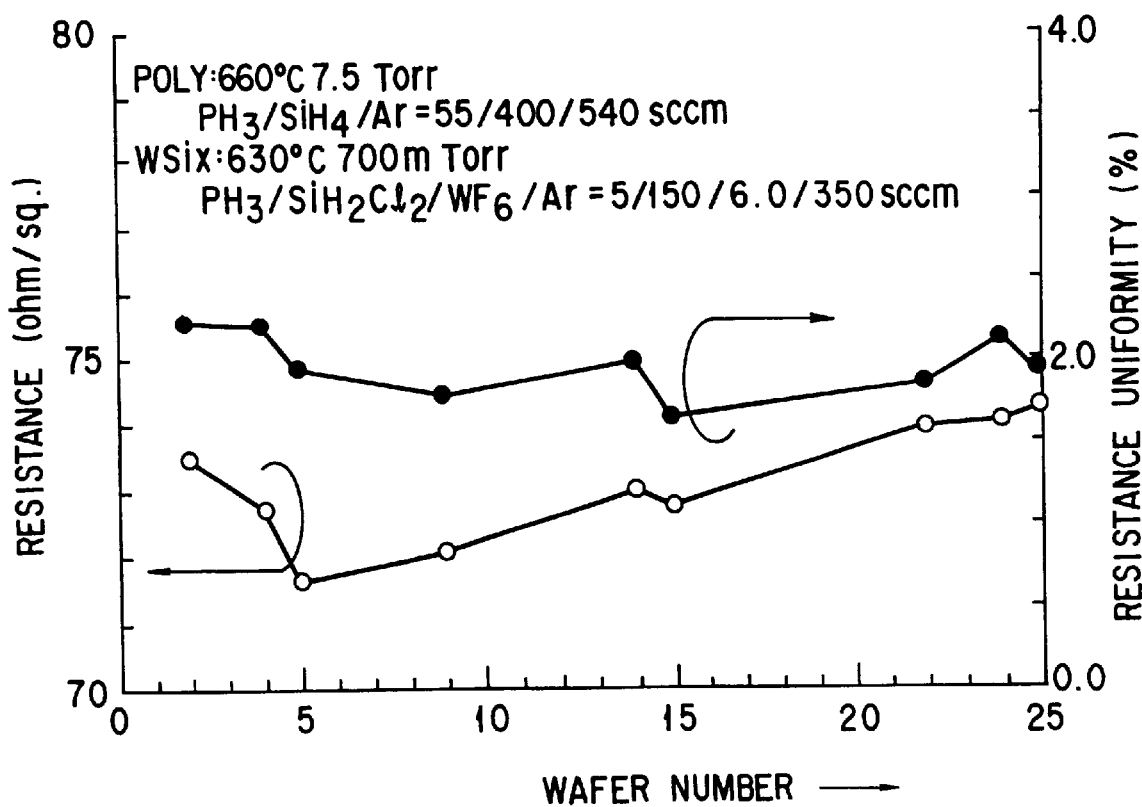
FIG. 2A is a graph showing the resistance of a gate electrode and the uniformity with respect to 25 pieces of wafers each has a structure shown in FIG. 1.
Figure 2B:
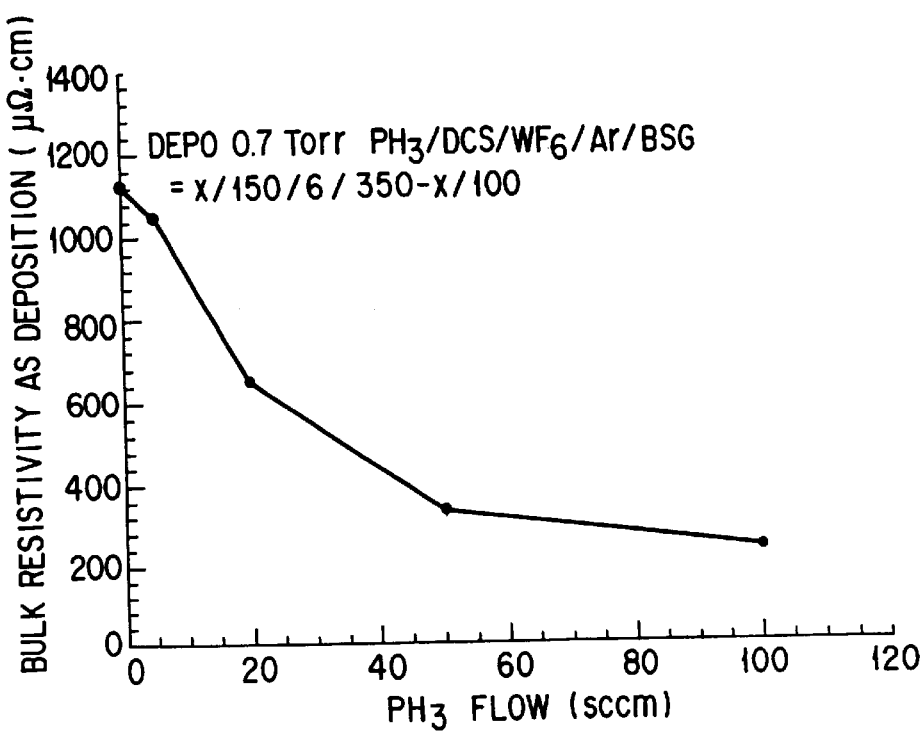
FIG. 2B is a graph showing a relationship between the resistivity of tungsten silicide layer of a gate electrode of the structure shown in FIG. 1 and flow rate of impurities doped in the upper layer.
Figure 2C:
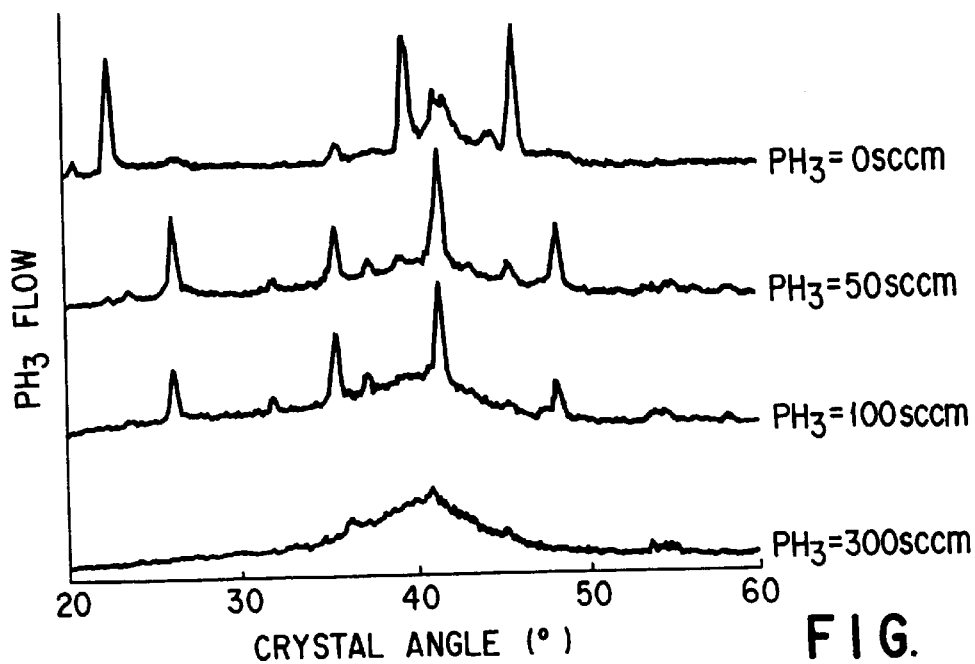
FIG. 2C is a graph showing a relationship between crystallity of the upper layer shown in FIG. 1 and flow rate of impurities doped in the upper layer.

FIG. 2A is a graph showing the sheet resistance of a gate electrode and the uniformity thereof when 25 pieces of wafers are processed under the film formation conditions as described above. Note that the values of this graph are obtained after film formation. FIG. 2B shows that the bulk resistivity of the tungsten silicide layer decreases according to the increase of flow rate of $PH_3$, that is, an impurity concentration in the tungsten silicide layer. FIG. 2C shows that crystallity of the tungsten silicide layer reaches an amorphous state as the flow rate of $PH_3$ increases. For example, when the flow rate is 300 sccm, the crystallity almost shows an amorphous state.

From the figure, it is found that each wafer has an excellent uniformity of about 2% and does not have characteristic variation, leading to an excellent result.

Figure 9A:
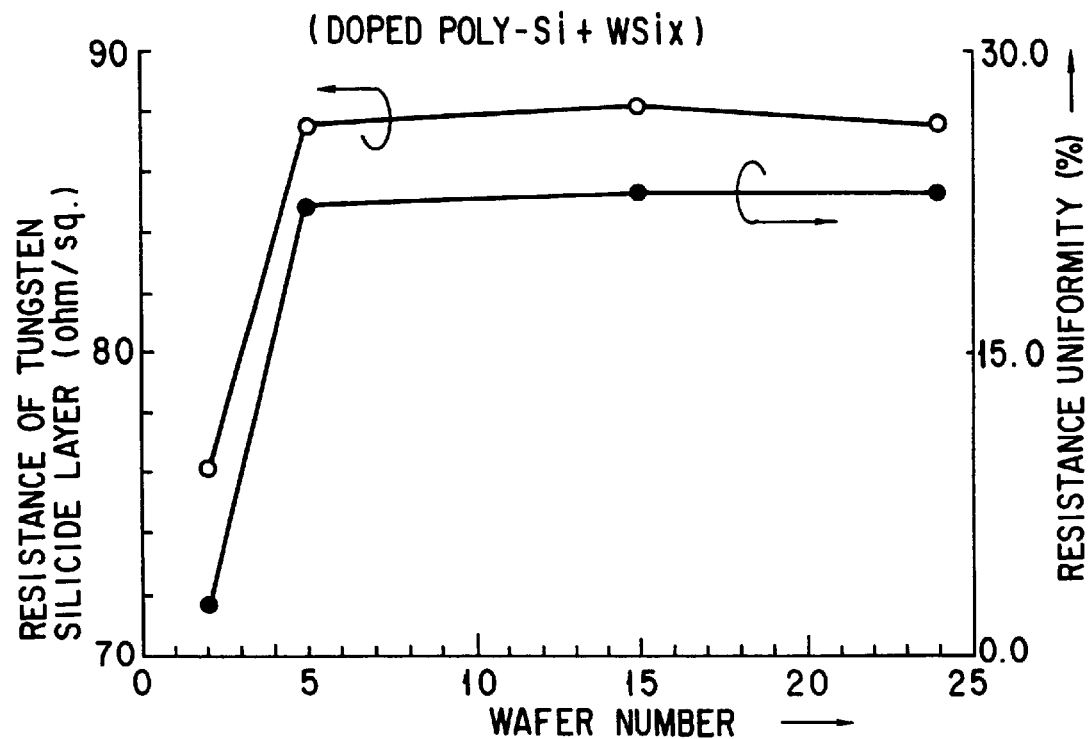
FIGS. 9A and 9B are graphs showing the resistance of a tungsten silicide layer of a gate electrode and the uniformity thereof when a lower layer is doped with impurities (FIG. 9A) and when a lower layer is not doped with impurities (FIG. 9B).
Figure 9B:
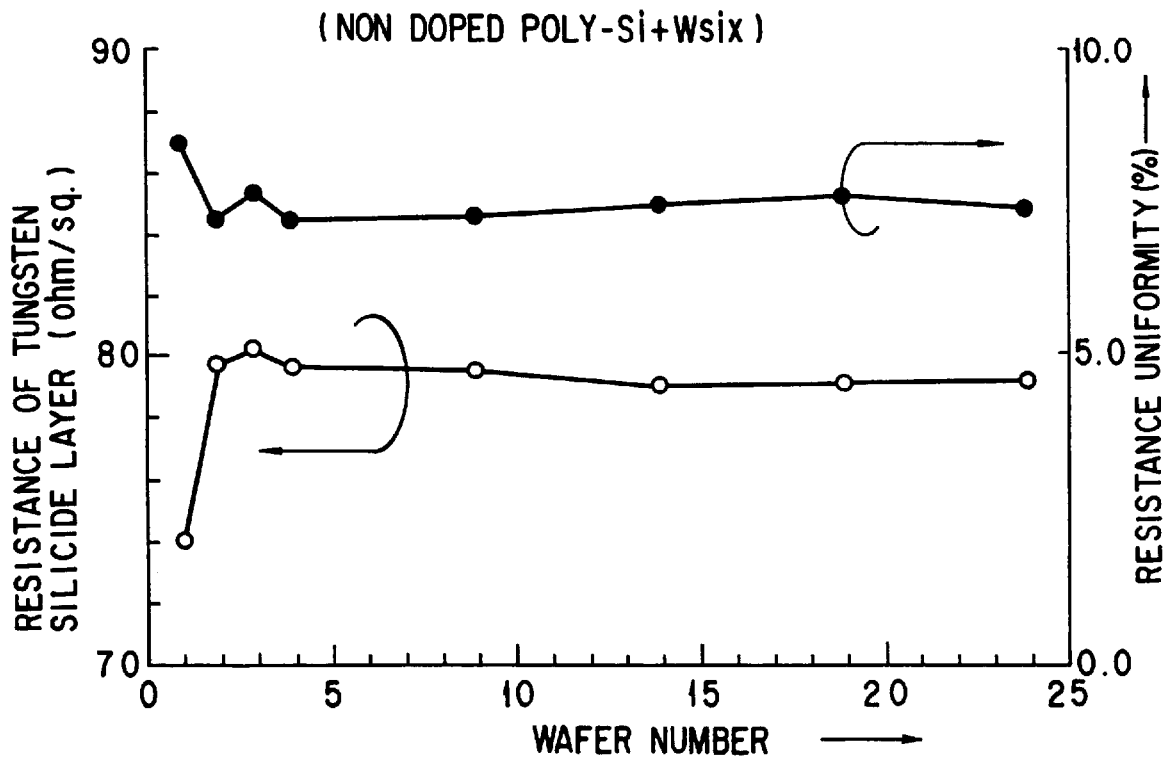

In contrast, in case where phosphorus is not doped in the upper tungsten silicide layer 12, the uniformity of the resistance of the gate electrode is about 25% as shown in FIG. 9A and the characteristic variation is thus large, resulting in that the electric characteristic is greatly degraded.

Thus, by previously doping uniformly impurities into the upper tungsten silicide layer 12, it is possible to eliminate bad influences from impurities of the lower poly-crystal silicon layer 10. Here, the density of impurities in each layer is measured by a SIMS (Secondary Ion Micro Scope). The phosphorus density of the lower poly-crystal silicon layer 10 is on the order of substantial $10^{20}$ atms/cc while the phosphorus density of the upper tungsten silicide layer 12 is on the order of substantial $10^{19}$ atms/cc and is thus smaller by one order of magnitude than that the lower layer 10. The phosphorus density of the tungsten silicide layer 12 is not limited to the density described above as long as the phosphorus density can cancel influences from diffusion of phosphorus in the lower poly-crystal silicon layer 10. However, it will be easily under-stood that this effect is increased as the amount of impurities previously doped uniformly in the tungsten silicide layer 12 is increased.

Although a white turbidity is viewed with eyes on the surface of the wafer shown in FIG. 9A and the morphogy is thus degraded, no white turbidity is confirmed in the present embodiment and the morphogy is thus improved.

Next, a second embodiment will be described below.

Figure 3:
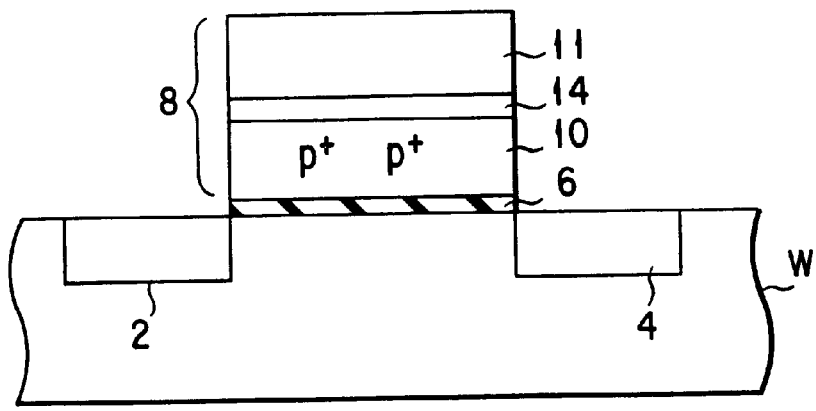
FIG. 3 is a view schematically showing a multi-layer structure according to a second embodiment of the present invention.

FIG. 3 is an enlarged cross-sectional view showing a multi-layer structure according to the second embodiment. The same portions as those shown in FIG. 1 will be denoted by the same reference symbols.

Figure 7A:
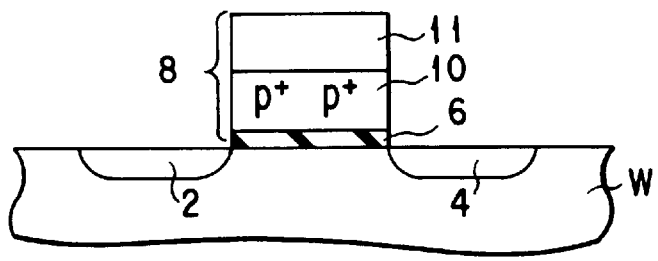
FIGS. 7A and 7B are views for explaining a conventional gate electrode, wherein FIG. 7A schematically shows the structure of the gate electrode
Figure 7B:
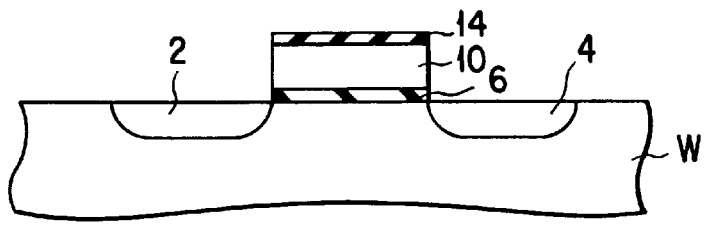
Figure 8:
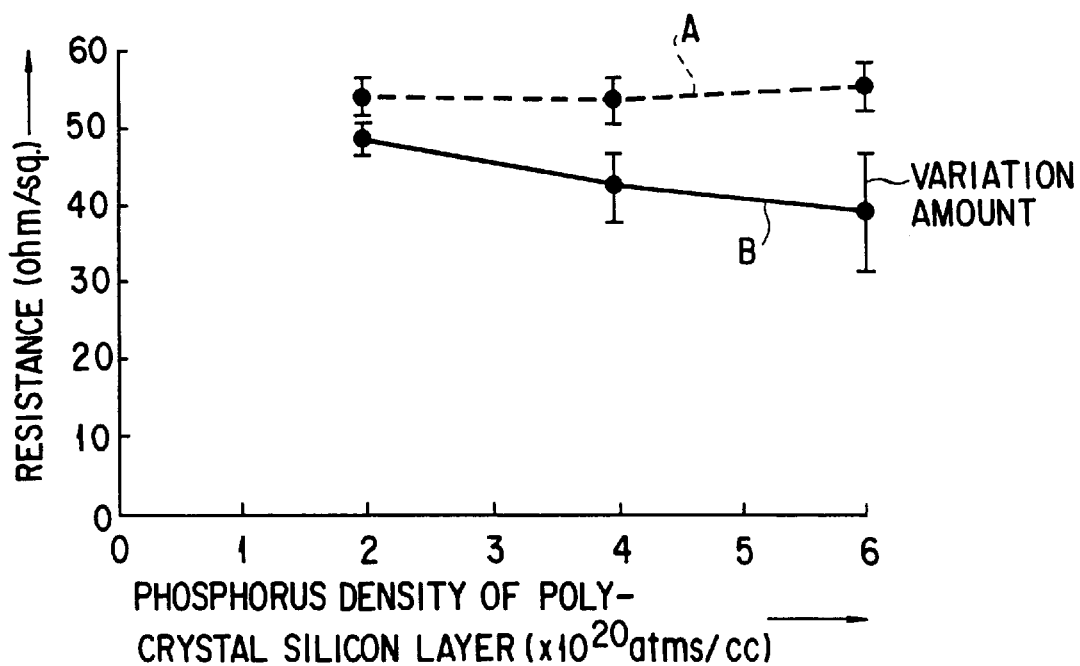
FIG. 8 is a graph showing the resistance of a conventional gate electrode and variations thereof with respect to a doping amount of phosphorus of a poly-crystal silicon layer.

The structure according to the second embodiment is different from that of the first embodiment in that a so-called non-doped thin poly-crystal silicon layer 14 as a thin block layer containing no impurities is directly formed on the upper surface of a poly-crystal silicon layer 10 doped with phosphorus, and a non-doped tungsten silicide layer 11 having the same structure as a conventional structure shown in FIG. 7A is formed on the layer 14.

The film formation method thereof will be as follow. A first poly-crystal silicon layer 10 doped with phosphorus is formed as explained in the first embodiment, and thereafter, a second poly-crystal silicon layer 14 not doped and a tungsten silicide layer 11 also not doped are sequentially formed. The non-doped second poly-crystal silicon layer 14 can be formed by reducing, to zero, the flow amount of the $PH_3$ gas used when forming the first poly-crystal silicon layer 10 as a lower layer doped with phosphorus and by making only the $SiH_4$ gas and Ar gas flow. The film thickness should preferably be set in a range of, for example, 50 Å to 500 Å within which phosphorus diffusion does not affect the tungsten silicide layer 11 as an upper layer, although the film thickness may depend on the phosphorus density of the first poly-crystal silicon layer 10 as a lower layer.

The tungsten silicide layer 11 is formed by stopping supply of the $PH_3$ gas used when forming the phosphorus-doped tungsten silicide layer 12 according to the former embodiment and by making only the $SiH_2Cl_2$ gas, $WF_6$ gas, and Ar gas flow. Thus, since the second thin non-doped poly-crystal layer 14 is formed on the first phosphorus-doped poly-crystal silicon layer 10, phosphorus diffusing upwards from the first poly-crystal silicon layer 10 is blocked by the second thin non-doped poly-crystal silicon layer 14 and cannot diffuse further upward than the layer 14 even if a heat treatment or the like is carried out in a subsequent manufacturing step. It is therefore possible to prevent phosphorus from entering and diffusing into the non-doped tungsten silicide layer 11 as an upper layer.

Figure 4:
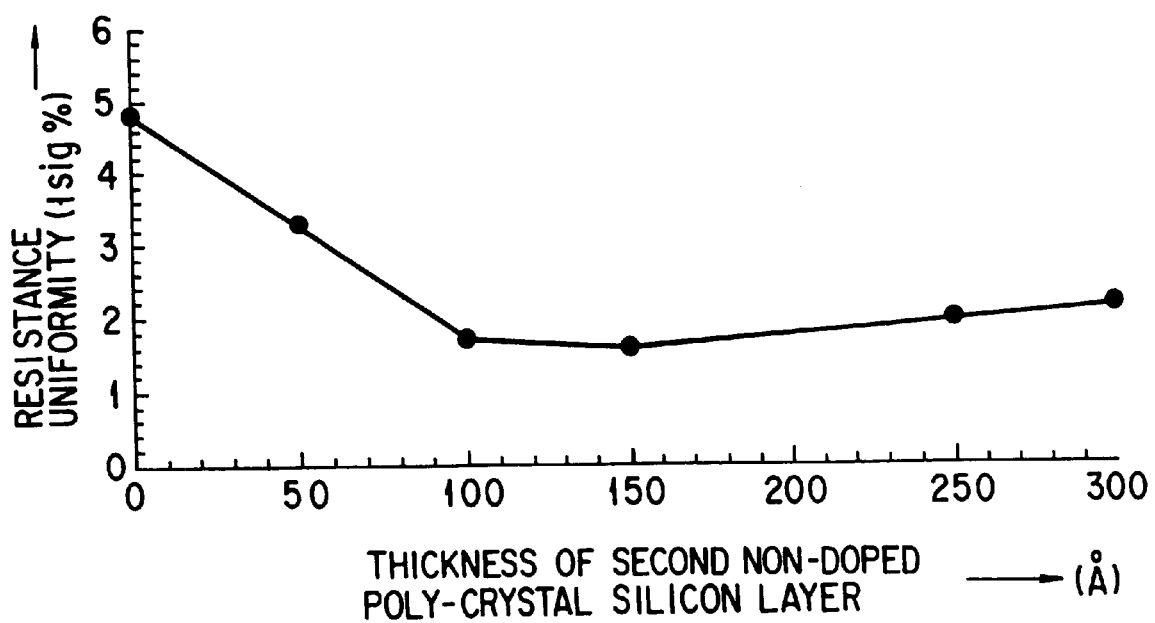
FIG. 4 is a graph showing a relationship between the uniformity of the resistance of a gate electrode of the multi-layer structure shown in FIG. 3 and the film thickness of a second poly-crystal silicon layer thereof.

In this case, the uniformity of the resistance of the gate electrode will be shown in FIG. 4. In FIG. 4, the abscissa represents the thickness of the second non-doped poly-crystal layer 14 which serves as a block layer. Note that the first poly-crystal silicon layer 10 as a lower layer has a phosphorus density of substantial $6 \times 10^{20}$ atms/cc. As is apparent from the graph, when the thickness is substantially 100 Å or more, the uniformity of the resistance of the gate electrode is constant at substantial 2% and thus shows a preferable characteristic. An appropriate range of the thickness of the second poly-crystal silicon layer 14 depends on the phosphorus density of the first poly-crystal silicon layer 10 as a lower layer, as described above, and the thickness is decreased to be thinner as the phosphorus density is decreased. The appropriate range is substantially 50 Å to 500 Å. When the thickness is smaller than 50 Å, the effect as a block layer is weakened. When the thickness is greater than 500 Å, the gate resistance becomes to high and is not preferable.

Next, a third embodiment will be explained below.

Figure 5:
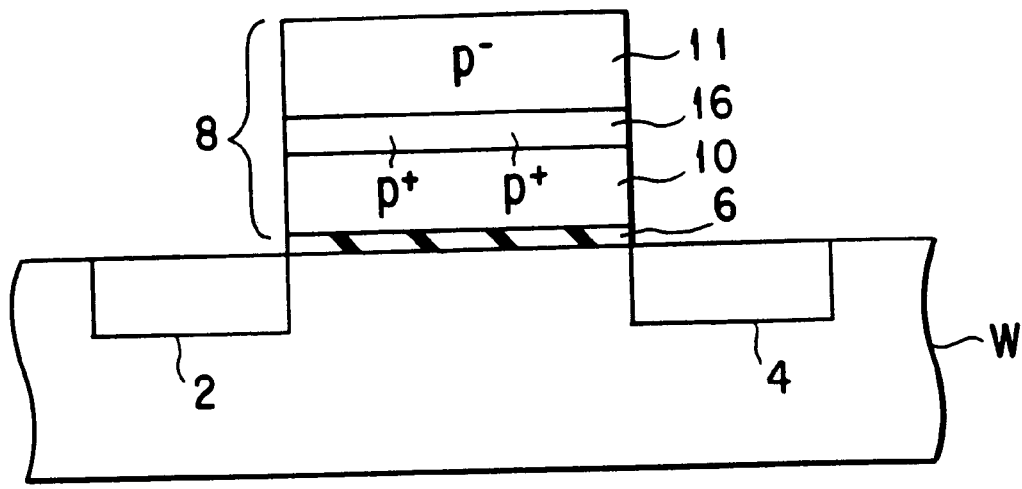
FIG. 5 is a view schematically showing a multi-layer structure according to a third embodiment of the present invention.

FIG. 5 is an enlarged cross-sectional view showing a multi-layer structure according to the third embodiment. The same portions as those shown in FIG. 3 will be denoted by the same references.

The third embodiment is different from the second embodiment in the following respect. In the second embodiment, a second non-doped poly-crystal silicon layer 14 is inserted between a first phosphorus-doped poly-crystal silicon layer 10 and a non-doped tungsten silicide layer 11. However, in the third embodiment, a poly-crystal silicon layer 16 doped with impurities at a lower density than the impurity density of a first poly-crystal silicon layer 10 as a lower layer is formed as a second poly-crystal silicon layer in place of the second poly-crystal silicon layer 14.

In order to dope phosphorus at a low density, a poly-crystal silicon layer may be formed while making only a slight amount of $PH_3$ gas flow (at a lower density than the impurity density for forming the first poly-crystal silicon layer 10). In this case, the second poly-crystal silicon layer 16 doped with phosphorus preferably has a thickness substantially equal to the thickness of the non-doped second poly-crystal layer 16, e.g., 50 Å to 500 Å. For example, the phosphorus density of the second poly-crystal silicon layer 16 is set to about $1 \times 10^{20}$ atms/cc and the phosphorus density of the first poly-crystal silicon layer 10 as a lower layer is set to $6 \times 10^{20}$ atms/cc.

In this case, also, the second poly-crystal silicon layer 16 serves as a block layer against diffusion of phosphorus from the first poly-crystal silicon layer 10, so that phosphorus can be prevented from unevenly diffusing into the tungsten silicide layer 11 as an upper layer.

Figure 6:
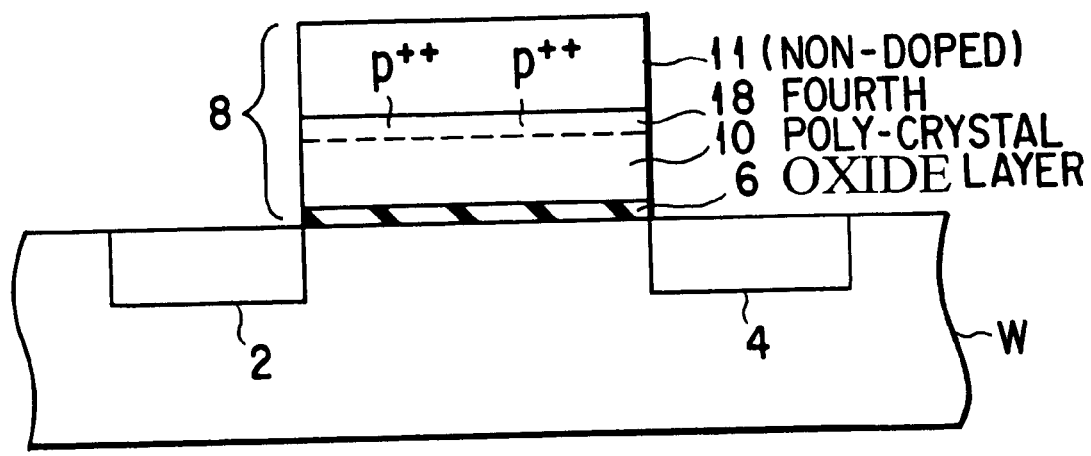
FIG. 6 is a view schematically showing a multi-layer structure according to a fourth embodiment of the present invention.

Next, a fourth embodiment will be explained with reference to FIG. 6.

The fourth embodiment is different from the third embodiment shown in FIG. 5 in that a poly-crystal silicon layer 18 having a higher density of phosphorus as impurities than that of a first poly-crystal silicon layer 10 is formed as a second poly-crystal silicon layer. The second poly-crystal silicon layer 18 may be formed to be integral with the first silicon layer 10. Therefore, the boundary between the first layer 10 and the second layer 18 is indicated by a broken line, in FIG. 6. This kind of second poly-crystal silicon layer 18 can be formed by making only a $PH_3$ gas and an Ar gas flow while supply of an $SiH_4$ gas is stopped or by increasing the flow amount $PH_3$ in the final stage of forming the first layer 10.

For example, the phosphorus density of the second poly-crystal silicon layer 18 can be increased to be as high as about $10^{21}$ atms/cc, in contrast to the first poly-crystal silicon layer 10 having a phosphorus density of about $6 \times 10^{20}$ atms/cc. According to this embodiment, since the portion of the single crystal silicon layer in contact with the non-doped tungsten silicide layer 11 has a high phosphorus density, phosphorus is uniformly diffused even if phosphorus is diffused again into the tungsten silicide layer 11. It is thus possible to prevent uneven diffusion.

In the embodiments described above, explanation has been made with reference to a case where phosphorus is doped as impurities of one conductive type. Impurities are not limited thereto but other impurities such as B, As, Sb, or the like are naturally applicable. In addition, one same kind of impurities need not be used for every layer, but impurities having one same conductive type may be doped, e.g., As or Sb may be doped as impurities with respect to P. It is apparent that the multi-layer structure is applicable not only to a gate electrode as described above but also to other electrodes, leads, or other structures which require a conductivity.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-layer structure comprising:

a first poly-crystal silicon layer doped with first impurities of one conductive type at a uniform density;

a second poly-crystal silicon layer formed on the first poly-crystal silicon layer so as to have a direct contact therewith, and doped with impurities, at a uniform distribution and at a higher density than the density of the first impurities; and a tungsten silicide layer formed on the second poly-crystal silicon layer so as to have a direct contact therewith, and containing no impurities of one conductive type.

2. A structure as recited in claim 1, wherein said tungsten silicide layer is formed on said second poly-crystal silicon layer on which no oxide layer has been formed.

3. A structure as recited in claim 1, comprising:

said second poly-crystal layer having a thickness in the range of 50 to 500Å.

4. A multi-layer structure comprising:

a poly-crystal silicon layer doped with first impurities of one conductive type at a uniform density; and a tungsten silicide layer formed on the poly-crystal silicon layer so as to have a direct contact therewith, and doped with second impurities of the same conductivity type as the first impurities, at a uniform density said first impurities being different than said second impurities.

5. A structure as recited in claim 4, comprising:

said poly-crystal layer having a thickness in the range of 50 to 500Å.

6. A structure as recited in claim 4, wherein a density of the second impurities is on the order of substantially $10^{19}$ atoms/cc.

7. A structure as recited in claim 4, wherein the first and second impurities are selected from P, B, As, and Sb.

8. A structure as recited in claim 4, wherein a density of the second impurities is so set that the uniform distribution of the second impurities in the tungsten silicide layer is not substantially affected by first impurities diffused from the poly-crystal silicon layer.

* * * * *